United States Patent [19]
McGarvey et al.

[11] Patent Number: 6,087,730
[45] Date of Patent: *Jul. 11, 2000

[54] ELECTRONIC DEVICES AND THEIR MANUFACTURE

[75] Inventors: Brian P. McGarvey, Ballinasloe, Ireland; Steven C. Deane, Red Hill, United Kingdom; Ian D. French, Hove, United Kingdom; Michael J. Trainor, Horley, United Kingdom

[73] Assignee: U.S. Philips Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/933,593

[22] Filed: Sep. 19, 1997

[30] Foreign Application Priority Data

Sep. 21, 1996 [GB] United Kingdom ............... 9619808
Nov. 7, 1996 [GB] United Kingdom ............... 9623221
May 23, 1997 [GB] United Kingdom ............... 9710514

[51] Int. Cl.$^7$ .................... H01L 23/48; H01L 23/52; H01L 29/40
[52] U.S. Cl. ........................... 257/766; 257/751
[58] Field of Search ...................... 257/766, 757, 257/767, 59, 72, 751; 349/47

[56] References Cited

U.S. PATENT DOCUMENTS

| | | |
|---|---|---|
| 4,963,701 | 10/1990 | Yasumoto et al. . |
| 5,083,190 | 1/1992 | Pfiester . |
| 5,130,829 | 7/1992 | Shannon ....................... 359/59 |
| 5,272,370 | 12/1993 | French . |
| 5,298,312 | 3/1994 | Oyama et al. . |
| 5,407,866 | 4/1995 | Sellers . |
| 5,691,090 | 11/1997 | Isao et al. . |
| 5,691,782 | 11/1997 | Nishikawa et al. . |

FOREIGN PATENT DOCUMENTS

| | | |
|---|---|---|
| 0221361B1 | 5/1987 | European Pat. Off. . |
| 0649048A1 | 4/1995 | European Pat. Off. . |
| 6-275827 | 9/1994 | Japan . |

OTHER PUBLICATIONS

"Proceedings of the 9th International Display Research Conference", Japan Display '89, Oct. 16–18, 1989, pp. 506–509.

Primary Examiner—Sheila V. Clark
Attorney, Agent, or Firm—Tony E. Piotrowski

[57] ABSTRACT

A thin-film circuit element such as a top-gate TFT has good quality electrical contacts formed between an electrode (151, 152, 155) of chromium nitride and the semiconductor film (50) of the circuit element and/or another conductive film such as a connection track (37,39,40) of, for example, aluminium. Chromium nitride has a particularly advantageous combination of properties for use as such an electrode material, including, for example, low affinity for oxide growth even during deposition thereon of semiconductor, insulating and/or metal films, a doping potential to enhance ohmic contact to semiconductors, a barrier function against potential impurities, good thin-film processing compatibility, and hillock prevention in an underlying aluminium conductor.

11 Claims, 5 Drawing Sheets

ELECTRONIC DEVICES AND THEIR MANUFACTURE

This invention relates to electronic devices, for example flat panel displays, and other types of large-area electronic device, comprising a thin-film circuit element. The invention also relates to methods of manufacturing such an electronic device.

There is currently much interest in developing thin-film circuits with thin-film transistors (hereinafter termed "TFTs") and/or other semiconductor circuit elements on glass and on other inexpensive insulating substrates, for large-area electronics applications. Such TFTs fabricated with amorphous or polycrystalline semiconductor films may form the switching elements in a cell matrix, for example in a flat panel display as described in United States Patent Specification U.S. Pat. No. 5,130,829 (Our Ref: PHB 33646), and/or in integrated drive circuits for such cell matrices. Thin-film diodes (hereinafter termed "TFDs") in the form of non-linear switching elements may be used instead of TFTs for the cell matrix of a display device, for example as described in published European Patent Application EP-A-0 649 048 (Our Ref: PHN 14613). United States Patent Specification U.S. Pat. No. 5,272,370 (Our Ref: PHB 33725) describes an example of a different type of large-area electronic device having an array of thin-film circuit elements, in this case a thin-film ROM device comprising different types of TFD having different conduction characteristics to determine the information content of the ROM array. The whole contents of U.S. Pat. No. 5,130,829, EP-A-0 649 048 and U.S. Pat. No. 5,272,370 are hereby incorporated herein as reference material.

In the development and manufacture of large-area electronic devices, it is recognised that the performance of the device can depend critically on the quality of the electrical contact between an electrode and a conductive film of a thin-film circuit element. There is a need to be able to form good quality contacts reproducibly and hence uniformly. A variety of materials are known for the electrodes and conductive films, for example as disclosed in U.S. Pat. No. 5,130,829, EP-A-0 649 048 and U.S. Pat. No. 5,272,370. In most cases the active area of a thin-film circuit element is a semiconductor conductive film most usually of silicon in an amorphous or microcrystalline or polycrystalline form or of a silicon-rich silicon compound. The silicon-based regions may be contacted by electrodes of, for example, chromium, tungsten, zinc, titanium, nickel, molybdenum, aluminium, and indium tin oxide (ITO). These electrodes may themselves be contacted by a conductive film (for example of aluminium, tungsten, molybdenum or ITO) which forms a pattern of interconnection tracks between these circuit elements. In most situations it is desirable for the electrode to make an ohmic contact of low resistance with the semiconductor and with the connection track, although in some cases the requirement is for a Schottky barrier of good quality.

The conference paper "An Ohmic Contact Formation Method for Fabricating α-Si TFTs on Large Size Substrates" by Yukawa et al published in Proceedings of the 9th International Display Research Conference, Oct. 16–18, 1989, Kyoto, Japan, Japan Display '89, pages 506–509 describes previous difficulties in making uniform low-resistance contacts for bottom drain and source electrodes to the silicon film of a top-gate TFT. These difficulties had resulted in most flat panel displays being formed with bottom-gate TFTs, in spite of the many advantages of top-gate TFTs. The conference paper describes the avoidance of these difficulties by using ITO for the source and drain electrodes and by doping the silicon film with phosphorus from the ITO source and drain electrode patterns. Thus, in the method described in the conference paper, a film of ITO deposited on the device substrate is etched to form a desired pattern of pixel electrodes and source and drain electrodes and tracks for the TFTs, and this ITO pattern is then exposed to an RF glow discharge of $PH_3$ (phosphine). As a result of this phosphine plasma exposure, phosphorus dopant is adhered to the surface of the ITO pattern but not significantly to the $SiO_2$ surface layer of the substrate exposed between the ITO pattern. After an optional etching stage, an undoped amorphous silicon film is then deposited to provide the channel region of the TFT. During this deposition, $n^+$ regions are formed in the amorphous silicon film adjacent the ITO pattern by phosphorus diffusion from the surface of the ITO. This doping of the semiconductor film from the ITO source and drain electrodes results in a good quality low resistance ohmic contact for the source and drain electrodes of the TFT. However, the need to deposit the silicon material on ITO does limit the deposition parameters, for example, to deposition temperatures of less than 250° C. Furthermore, some source gas compositions with a hydrogen gas content as commonly used for silicon deposition (for example $SiH_4$ with $H_2$) are preferably not used with this process in order to prevent undesirable interactions with the ITO (for example hydrogen reduction of the ITO). If these limitations are not respected, surface decomposition of the ITO can occur, and the quality of the silicon film can be degraded by impurity diffusion from the ITO.

A top-gate TFT having source and drain electrodes of ITO and in which doped regions are formed in the overlying semi-conductor layer in similar manner through diffusion of phosphorus dopant contained in the ITO is described in EP-B-0 221 361. In this TFT, the ITO source and drain electrodes are formed also with tapered side walls.

It is an aim of the present invention to provide an electrode material suitable for forming good electrical contacts to semiconductor films and/or other conductive films used in thin-film processing for large-area electronic devices, while easing the limitations imposed on the thin-film process parameters.

According to one aspect of the present invention there is provided an electronic device including a thin-film circuit element which comprises an electrode in electrical contact with a conductive film (for example, of a silicon-based material or other semiconductor-based material), characterised in that the electrode comprises a film of chromium nitride.

The present invention is based on the discovery by the present inventors that chromium nitride surprisingly has a particularly advantageous combination of properties for use as an electrode material of thin-film circuit elements. Films of crystalline amorphous chromium nitride with low tensile stress, a range of nitrogen contents and good film integrity can be readily and controllably deposited at low temperature, for example at room temperature, by low-cost reactive sputtering. Chromium nitride processing is compatible with current thin-film circuit element technologies. The chromium nitride films can be patterned using etchants already used in thin-film technology for etching chromium, for example with low-cost wet-etching processes using ammonium ceric nitrate with nitric acid and/or hydrochloric acid. The chromium nitride films are chemically less reactive than chromium itself, ITO and many other electrode materials. They have a low affinity for oxide growth but they still have a relatively high conductivity, as a result of which high resistance barrier interfaces to semiconductor regions and/or to metal conductor tracks can be avoided. A chromium nitride film can protect an underlying film against hydrogen reduction and can also act as an effective barrier against impurity diffusion so protecting semiconductor regions against indium and other impurities. Thus, the chromium nitride film can protect an overlying semiconductor film during deposition, against contamination from an underlying film pattern of, for example, ITO, aluminium, molybdenum or another conductive material. Furthermore, a chromium nitride film pattern can even be used to dope an adjacent semiconductor region with conductivity type determining dopant for example using the plasma doping process described before. Under appropriate conditions, when the chromium nitride film has a very high nitrogen content, the adjacent semiconductor region may even be doped with nitrogen diffused from the chromium nitride film itself. This can be particularly useful with silicon semiconductor films, in which nitrogen is a donor dopant.

It may be noted that laid-open Japanese patent application JP-A-06-275827 discloses forming an electrode from a chromium film which contains at least one element selected from the group of nitrogen, carbon and fluorine, the element content changing across the film thickness to give the upper part of the film a faster etching rate than the lower part. The film composition is adapted to provide the etched electrode with tapered sides so that it is suited for forming, on a device substrate, a bottom gate electrode of a TFT. The tapered shape improves the covering of the gate electrode by an insulating film which provides the gate dielectric of the TFT. The active channel region of the TFT is provided by a semiconductor film which is deposited on this insulating film and which does not contact the gate electrode. In the case of a nitrogen content, the upper part of the film which contains the nitrogen may be removed before the next material (the insulating film) is deposited. JP-A-06-275827 does not disclose the use of chromium nitride as part of an electrode in situations to which the present invention relates nor with the advantages provided in accordance with the present invention.

In an electronic device in accordance with the present invention the electrode may be of chromium nitride throughout its thickness or at least adjacent an area of the conductive film with which it forms electrical contact. This adjacent area of the conductive film may generally comprise a semiconductor material such as, for example, amorphous silicon or microcrystalline silicon or polycrystalline silicon or an amorphous silicon-rich silicon compound material. The chromium nitride film is well suited to forming a bottom electrode able to withstand the subsequent deposition of a semiconductor conductive film and to withstand subsequent processing steps, without degrading the semiconductor film. Deposition temperatures in excess of 250° C. (for example up to 300° C. or more) may be used. Thus, the electrode comprising the film of chromium nitride may be carried on a substrate of the device, between the substrate and an overlying area of the semiconductor conductive film.

The electrode may be present between the said adjacent area of the semiconductor conductive film and an area which may be a potential source of impurity, for example at the substrate surface. The chromium nitride film of the electrode may provide an impurity diffusion barrier protecting the said adjacent area of the semiconductor conductive film. The potential impurities may be of indium from a film of ITO. Thus, the chromium nitride may provide a barrier against indium diffusion into the said adjacent area of the semiconductor film. This aspect is particularly useful for flat panel displays and other large-area electronic devices in which it is desirable to connect an ITO pattern (for example as a transparent pixel electrode) to a bottom electrode of a thin-film transistor or other circuit element. Furthermore the chromium nitride film can act as an effective diffusion barrier against the penetration of hydrogen during semiconductor CVD (chemical vapour deposition) from a gas source comprising hydrogen, and so hydrogen reduction of ITO can be avoided by providing a chromium nitride barrier film over the ITO.

As already mentioned, the adjacent area of the semiconductor conductive film may be doped with a conductivity type determining dopant concentration extending from the electrode comprising the chromium nitride. The said adjacent area of the semiconductor conductive film may be doped with, for example, boron or phosphorus or another dopant from the electrode. This may be carried out using the plasma doping process described before to adsorb the dopant to the surface of the electrode. Thus, for example, it is found that phosphorus adheres satisfactorily to a chromium nitride film pattern on a device substrate exposed to a phosphine plasma, whereas the applicants find that when a chromium pattern is exposed to such plasma there is insufficient adsorption of phosphorus to the chromium to act as a subsequent diffusion source.

Such an electrode comprising chromium nitride in electrical contact with a semiconductor conductive film may be used in various thin-film circuit element configurations. Thus, for example, the circuit element may be a thin-film transistor, and the electrode may comprise a source electrode or drain electrode or a gate electrode of the transistor. In another form, the circuit element may be a thin-film diode having regions of the semiconductor conductive film doped with opposite conductivity type dopant concentrations to provide a PIN region structure, and an anode and/or cathode electrode of the diode may comprise the chromium nitride film. In yet another form, the circuit element may be a thin-film diode whose semiconductor conductive film is a silicon-rich non-stoichiometric silicon compound material, and the anode and/or cathode electrode of this diode may comprise a chromium nitride film in accordance with the present invention.

According to a second aspect of the second invention, there is provided an electronic device including a thin-film transistor having a gate electrode, a source electrode and a drain electrode, characterised in that at least one of said electrodes comprises a film of chromium nitride. The present invention is particularly advantageous for avoiding and reducing problems in so-called "top-gate" TFTs. In a top-gate TFT, the gate electrode is present on a gate dielectric on an upper face of a semiconductor film which provides a channel region of the TFT.

The present invention can be used with advantage to overcome a particular contact problem to this gate electrode of the top-gate TFT. This gate electrode may be of chromium nitride at least at its upper face, and a gate connection track may contact electrically this upper face of the gate electrode at a window in an insulating film which is provided on the gate electrode. The applicants find that in prior art arrangements with, for example, a chromium gate electrode a hard and insoluble high-resistance surface skin is formed at the face of the gate electrode, particularly when the insulating film is deposited at temperatures in excess of about 250° C. When, however, the gate electrode is of chromium nitride at least at its upper face, such a hard and insoluble surface skin is not formed, apparently due to the chemically less reactive nature of chromium nitride and its low affinity for oxide growth. Thus, use of the present invention for the gate electrode of a top-gate TFT permits the insulating film on the gate electrode to comprise silicon oxide and to be deposited at a high temperature so as to have very good insulating properties. These insulating properties can be important at other areas of the device where the insulating film may be present between two crossing conductor tracks.

The source and drain of a top-gate TFT may be formed as top electrodes or as bottom electrodes. The chemically less reactive nature of chromium nitride permits the electrode to withstand subsequent deposition of the semiconductor film and subsequent processing steps. Thus, the source and drain electrodes may comprise chromium nitride and may be present between the substrate and overlying areas of the semiconductor film, which overlying areas are contacted electrically by the source and drain electrodes. Due to its low affinity for oxide growth, these bottom electrodes of chromium nitride can form good electrical contacts to the semiconductor film. Thus, it is advantageous for the source and drain electrodes to be of chromium nitride at least where they contact the overlying areas of the semiconductor film. Furthermore, these overlying areas of the semiconductor film may be doped with a conductivity type determining dopant concentration from the source and drain electrodes.

The chemical reactivity and oxide growth affinity of chromium nitride reduces with increase in the nitrogen content of the chromium nitride. Advantageously, the film of chromium nitride comprises more than 15 atomic percent of nitrogen over at least a part of its thickness. In most cases a much higher atomic percentage will be preferred, for example between 30 and 50 atomic percent of nitrogen over at least a part of the thickness of the film. The inventors find it preferable to have a high nitrogen content adjacent the area of electrical contact. When the chromium nitride is deposited by sputtering in a gas mixture of an inert gas and nitrogen, the nitrogen content of the chromium nitride film is a function of the nitrogen percentage in the gas mixture and also depends on the pressure of the gas mixture. The amount of oxide formed at the chromium nitride surface is a function of the nitrogen percentage of the chromium nitride film. Thus, to reduce the amount of oxide present at the contact surface it is advantageous to have a high nitrogen percentage in the chromium nitride film at the surface. This same nitrogen percentage may be kept throughout the thickness of the film or the film may have a variation in its nitrogen percentage with, for example, the highest percentage being adjacent the surface. The nitrogen content may vary progressively or step-wise through the thickness of the electrode film.

When the N content of the chromium nitride film is between 45% and 50%, its conductivity is reduced by a factor of 2 as compared with a chromium film. It is therefore advantageous to limit the chromium nitride electrode to the contact area, although the chromium nitride may also provide short lengths of conductor tracks. However, it is preferable to provide long conductor tracks of a more conductive material, for example aluminium or molybdenum or even ITO. Aluminium is an excellent material for low resistance tracks, but has potential problems with respect to surface oxidation, hillock formation and potential contamination of an overlying semiconductor film. Embodiments of the present invention permit these problems with aluminium to be overcome or reduced using a chromium nitride film in accordance with the invention. Several advantageous arrangements of the chromium nitride may be used.

Thus, in one such arrangement for a low-resistance connection to a source or drain electrode of a TFT, the film of chromium nitride may be deposited over a connection track for one of the source and drain electrodes, the connection track being of a material, for example aluminium, having a higher conductivity than the chromium nitride with which it is in electrical contact. The chromium nitride over the connection track can reduce hillock problems which occur with, for example, aluminium, and it can act as a barrier against diffusion of aluminium and other impurity from the connection track into the TFT (or TFD) body. So as to avoid introducing a step-coverage problem and to minimise undesirable interactions with the TFT body, the connection track may be provided at an area of the substrate offset with respect to an area where the transistor is to be formed, and the film of chromium nitride may extend laterally from the connection track to the area of the transistor. Similar arrangements may be used for a low-resistance connection to a TFD thin-film diode.

In the case of a top-gate TFT as the circuit element, when (as described above) the gate electrode is of chromium nitride at least at its upper face, an insulating film of, for example, silicon oxide may be deposited on the gate electrode, and a window may be etched in the insulating film to expose an upper face of the gate electrode for contacting with a low-resistance gate connection track of, for example, aluminium.

According to a third aspect of the present invention, there is provided a method of manufacturing an electronic device comprising a thin-film circuit element having an electrode in electrical contact with a conductive film, including the step of depositing the conductive film on an upper face of the electrode, characterised in that at least adjacent its upper face the electrode comprises a film of chromium nitride.

Such a method may be used with advantage for the manufacture of devices in which the electrode comprising the chromium nitride contacts a semiconductor-based film as a bottom electrode of a thin-film diode or a thin-film transistor. It is particularly advantageous for the manufacture of top-gate TFTs.

Thus, according to a fourth aspect of the present invention, there is provided a method of manufacturing an electronic device comprising a thin-film transistor, including the steps of forming source and drain electrodes on a substrate, depositing a semiconductor film to provide a channel region of the thin-film transistor between the source and drain electrodes, depositing a gate dielectric on an upper face of the semiconductor film, and forming a gate electrode on the gate dielectric, characterised in that at least one of said electrodes comprises a film of chromium nitride.

Thus, the film of chromium nitride may be deposited to provide at least an upper part of the source and drain electrodes before depositing the semiconductor film. This film of chromium nitride may be deposited with a higher nitrogen content adjacent its upper face, after which the source and drain electrodes are formed with tapered side walls by etching the film using a wet etch process. Furthermore, (as already described above) the chromium nitride of the source and drain electrodes may be doped with dopant which determines a conductivity type in the semiconductor film, and overlying areas of the semiconductor film may be doped with a conductivity type determining dopant concentration from the source and drain electrodes during the deposition of the semiconductor film. These source and drain electrodes of chromium nitride may be exposed to a plasma dopant source for the conductivity type determining dopant before depositing the semiconductor film.

By grading the nitrogen content of the chromium nitride film through its thickness, an electrode having tapering, or bevelled, side walls can conveniently be obtained upon etching the film using a wet etch process. Such tapering is beneficial, for example, for the source or drain electrodes in a top-gate TFT, or the lower electrode in a TFD as regards particularly the avoidance of step coverage problems with subsequently deposited layers.

These and other features of the present invention, and their advantages are illustrated specifically in embodiments of the invention now to be described, by way of example, with reference to the accompanying diagrammatic drawings, in which.

It should be noted that FIGS. 1 to 6, 11 and 12 of the drawings are diagrammatic and not drawn to scale. Relative dimensions and proportions of parts of these cross-sectional views have been shown exaggerated or reduced in size for the sake of clarity and convenience in the drawing. The same reference signs are generally used to refer to corresponding or similar features in different embodiments.

Figure 1:
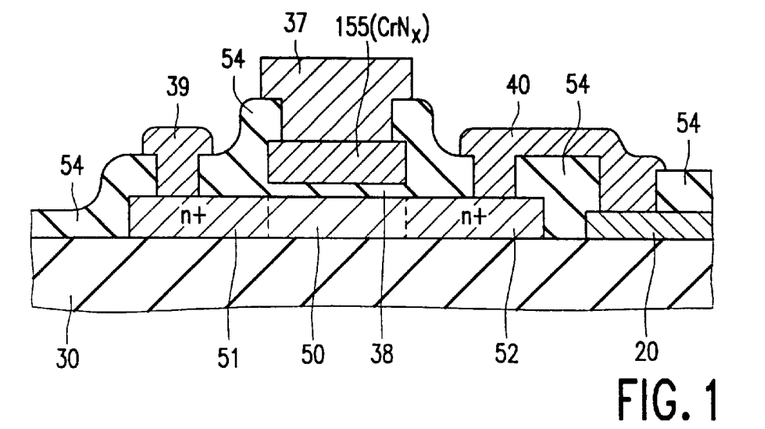
FIG. 1 is a cross-sectional view of a TFT in a part of an electronic device in accordance with the present invention.

The large-area electronic device, part of which is illustrated in FIG. 1, may be, for example, a flat panel display of the type illustrated in U.S. Pat. No. 5,130,829. Thus, a back plate of the display may provide a substrate 30 on a first major surface of which the TFT of FIG. 1 is provided. The device substrate 30 is electrically insulating at least adjacent this first major surface. The substrate may comprise a glass or another low-cost insulating material. Opaque light shields may be embedded between insulating layers at the upper face of the substrate. In a particular embodiment, the substrate 30 may comprise a glass base having an upper surface layer of silicon dioxide or silicon nitride or silicon oxynitride. A large number of individual TFTs are formed side by side on this upper surface and are interconnected by thin-film conductor patterns such as metal tracks 37,39 and 40. The TFT of FIG. 1 is of top-gate configuration similar to that illustrated for the TFT 11 in FIG. 6 of U.S. Pat. No. 5,130,829. To facilitate comparison, the TFT parts of FIG. 1 are given the same or similar reference signs as in U.S. Pat. No. 5,130,829. However, at least one of the electrodes of the TFT of FIG. 1 comprises a film of chromium nitride in accordance with the present invention.

The TFT of FIG. 1 comprises a channel region provided by a semiconductor film 50 of, for example, polycrystalline silicon on the substrate 30. A gate electrode 155 is present on a gate dielectric 38 of, for example, silicon oxide on an upper face of the semiconductor film 50. Doped source and drain regions 51 and 52 in the semiconductor film may be autoregistered with the gate electrode 155, for example by ion implantation. A gate connection track 37 of, for example, aluminium contacts electrically an upper face of the gate electrode 155 at a window in an insulating film 54 of, for example, silicon oxide on the gate electrode 155.

In this example in accordance with the present invention, the gate electrode 155 is of chromium nitride at least at its upper face where contacted by the connection track 37. By contrast therewith the top-gate TFT of FIG. 6 of U.S. Pat. No. 5,130,829 has a gate electrode 55 of doped polycrystalline silicon. The gate electrode 155 of the TFT of FIG. 1 may be of chromium nitride throughout its thickness in the compact connection form shown in FIG. 1, in which the connection track 37 contacts the electrode 155 at the area of the TFT. However, the electrode 155 of a TFT in accordance with the invention may be a composite comprising chromium nitride on another electrode material, for example on chromium or on aluminium or an aluminium alloy. This composite form of electrode 155 is advantageous in reducing gate series resistance when the electrode 155 extends some distance from the TFT before being contacted by the gate connection track 37.

An advantage of providing chromium nitride on an aluminium track/electrode is that it caps the aluminium to prevent both oxidation of the aluminium surface and the formation of hillocks in the aluminium. Without this chromium nitride capping, such surface oxidation and hillock formation can occur in the aluminium track/electrode when the substrate 30 is heated to about 250° C. or more, for example during the deposition of a silicon oxide film 54. A further advantage of providing chromium nitride on an aluminium electrode is that it protects the upper face of the aluminium against attack by an etchant (for example HF) used to open a contact window in an insulating film 54. An advantage of using chromium nitride instead of chromium for the upper face of the electrode 155 is that the formation of an insoluble high resistance oxide layer is avoided at the upper surface of the electrode 155 during the deposition of the silicon oxide film 54.

Figure 2:
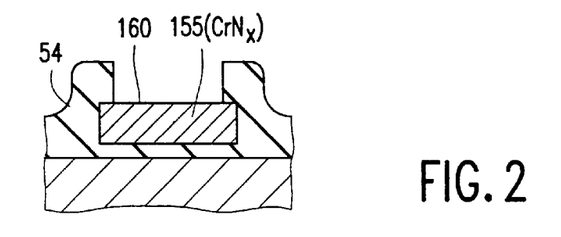
FIG. 2 is a cross-sectional view of part of the TFT of FIG. 1 at a stage in its manufacture by a method in accordance with the present invention.

FIG. 2 illustrates a step in the manufacture of this TFT in which a contact window is opened in the silicon oxide film 54 to expose the upper surface 160 of the electrode 155, which is the gate electrode in this example. The contact window is defined using a photolithographic and etching treatment with, for example, buffered HF as the etchant. The inventors find that when the upper surface 160 of the electrode 155 is of chromium and not chromium nitride, this etching treatment does not remove a high resistance oxide layer at the upper face 160 of a chromium electrode 155. The oxide layer is sufficiently hard that the present inventors find it can only be removed by sputter-etching, or alternatively it can be broken down electrically by applying a high voltage to the electrode connection 37 after fabrication of the TFT. These additional steps necessary with a chromium electrode 155 reduce the manufacturing yield and increase the cost of manufacture. These additional steps are not required when the upper surface 160 of the electrode 155 is of chromium nitride in accordance with the present invention.

The mechanism by which the chromium nitride prevents the formation of this high resistance oxide layer appears to be as follows. Typically the silicon oxide film 54 is deposited at a temperature of about 250° C. or more. The silicon oxide film 54 may be deposited by AP (atmospheric pressure) CVD at about 400° C., or from TEOS (tetra ethyl oxy silane) or PE (plasma enhanced) CVD at a lower temperature, for example 300° C. As the substrate 30 approaches these deposition temperatures a mono-layer of oxide seems to form on the outside surface of the electrode 155. As more oxygen arrives at the film surface, a strong electric field is set up in the oxide layer due to the excess negative charge of the oxygen atoms. In the case of a chromium electrode 155, electrons drift with the field into the chromium layer and $Cr^{3+}$ ions drift to the surface and react with the adsorbed oxygen. Layers of chromium oxide (predominantly $Cr_2O_3$) are formed by this process on a chromium electrode 155 until the thickness of the oxide layer formed is such that the field is too low for any further drift of electrons or $Cr^{3+}$ ions. This electrically driven formation of oxide happens very rapidly (within nanoseconds), after which the growth rate becomes diffusion limited. It is important to note that in both stages the limiting step is migration of chromium ions through the oxide layer. By contrast therewith, nitrogen does not migrate through the initial surface oxide layer when the electrode 155 is of chromium nitride in accordance with the present invention. A nitrogen-rich region seems to form immediately beneath the surface oxide layer as chromium migrates to the surface. This nitrogen-rich region acts as a barrier to further migration of chromium into the oxide layer thereby limiting its growth. Thus, surface oxide growth at the upper face 160 of the electrode 155 can be controlled by regulating the nitrogen content of the chromium nitride electrode 155 adjacent its upper surface 160. Specific examples of particular results are described below with reference to FIGS. 7, 8 and 9.

The top-gate TFT of FIG. 1 may have its source and drain formed in known manner, for example as in FIG. 6 of U.S. Pat. No. 5,130,829. Thus, the source and drain may comprise n+ doped regions 51 and 52 respectively of the semiconductor film 50, with source and drain connections 39 and 40 which may be formed from the same aluminium film pattern as the gate connection 37. In the arrangement shown by way of example in FIG. 1, the doped drain electrode 52 is shown connected by the conduction track 40 to an ITO pixel electrode 20. However, other arrangements of source and drain electrodes are possible in accordance with the present invention.

Figure 3:
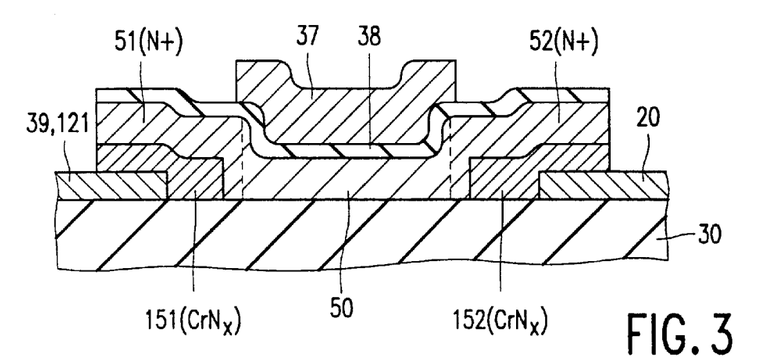
FIG. 3 is a cross-sectional view of another TFT in a part of another electronic device also in accordance with the present invention.

By way of example, FIG. 3 illustrates a source and drain configuration in accordance with the present invention comprising respective source and drain electrode areas 151 and 152 of a chromium nitride film. These chromium nitride source and drain electrodes 151 and 152 are present between the substrate 30 and overlying areas of the semiconductor film 50. The chromium nitride source and drain electrodes 151,152 form good ohmic contacts to the overlying areas of the film 50, due to the low affinity of chromium nitride for oxide growth and due also to the doping of these overlying areas 51,52 with a conductivity type determining dopant concentration from the source and drain electrodes 151,152. N+ doped source and drain regions 51,52 may be formed using the known plasma doping process with, for example, the process steps illustrated in FIGS. 4A to 4C. Specific examples of particular results are described below with reference to FIGS. 7, 8 and 10.

FIG. 3 illustrates a further difference in that the drain electrode 152 is directly connected to the ITO pixel electrode 20. Furthermore, in this case a part of the source connection track 39 may be formed by a part 121 of the same ITO film pattern as provides the pixel electrode 20. Due to their low chemical reactivity, the source and drain chromium nitride electrodes 151 and 152 can form good electrical contacts to the ITO parts 121 and 20. The chromium nitride source and drain electrodes 151,152 also completely separate the ITO parts 121 and 20 from the semiconductor film 50. This arrangement is particularly important during the manufacturing process when the chromium nitride source and drain electrodes 151,152 provide a barrier against hydrogen reduction of the ITO parts 121 and 20 and against diffusion of indium and other impurities into the semiconductor film 50 from the ITO parts 121 and 20.

Figure 4A:
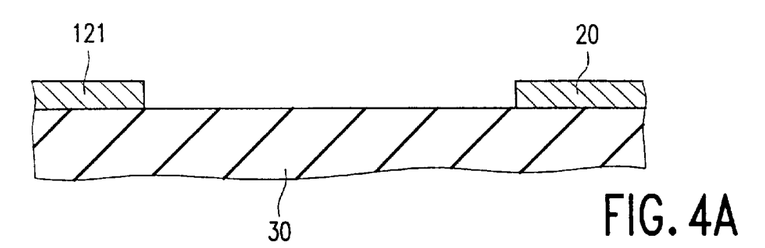
FIGS. 4A to 4C are cross-sectional views of the device part of FIG. 3 at successive stages in its manufacture by a method in accordance with the present invention.
Figure 4B:
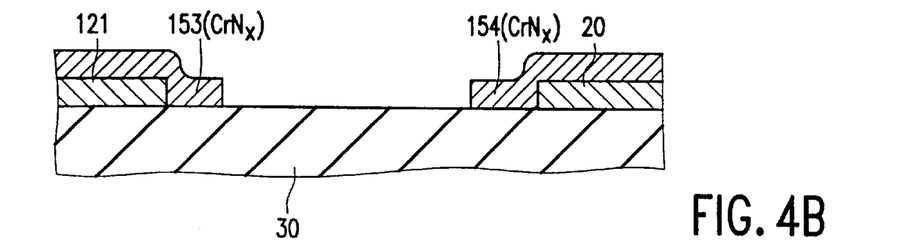
Figure 4C:
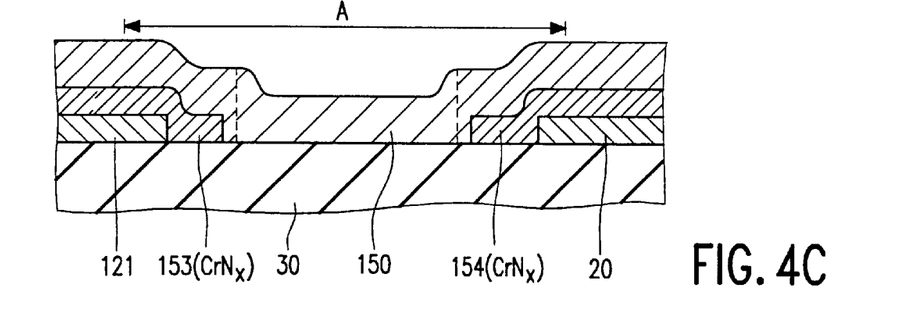

FIGS. 4A to 4C illustrate successive stages in the manufacture of the top-gate TFT of FIG. 3. An ITO film deposited on the device substrate 30 is patterned into the areas 121,20 of FIG. 4A using known photolithographic and etching processes. A chromium nitride film is then deposited and is patterned by existing photolithographic and etching processes into separate areas 153,154 defining the channel separation between the source and drain electrodes. The resulting structure is shown in FIG. 4B. The chromium nitride film areas 153 and 154 completely cover the ITO parts 121 and 20.

This structure of FIG. 4B is then exposed to an RF glow discharge of phosphine to adsorb phosphorus to the surface of the chromium nitride areas 153 and 154. No significant amount of phosphorus is adsorbed to the exposed insulating substrate surface between the chromium nitride parts 153, 154. However, a dry etching step may be performed, if so desired to completely remove dopant from the insulating substrate layer.

Silicon material is then deposited by, for example, a known plasma enhanced chemical vapour deposition (PECVD) process to form a film 150 of amorphous silicon. This amorphous-silicon deposition can be carried out at a temperature in the range of, for example, 270 to 300° C. which is much higher than the maximum temperature that can be used for the amorphous-silicon deposition on ITO according to the process described in the said Japan Display conference paper. Furthermore the deposition can be performed from a gas mixture of silane with hydrogen. Both the higher temperature and the hydrogen result in an improvement in the quality of the deposited film 150, which is manifest in terms of for example an increased field effect mobility and carrier lifetime and an improved stability which increases the lifetime of the display device. The hydrogen appears to act as a mild etchant removing weak areas of deposited silicon so that only good areas of silicon are grown. At this deposition temperature, the adsorbed phosphorus diffuses from the chromium nitride parts 153, 154 into the adjacent areas of the silicon 150 being deposited, and so n+ parts are formed in these adjacent silicon areas by the dopant diffusion during the deposition of the film 150. A small thickness of the gate dielectric film is now also preferably deposited in the same CVD reactor to protect the upper face of the silicon film 150 during a subsequent photolithographic and etching stage.

In this photolithographic and etching stage, a photoresist mask is provided over the TFT area A of the silicon film 150 and an etching treatment is carried out to define the individual islands 50 for the individual TFTs. Using the same mask, the chromium nitride areas 153,154 may now be patterned to form the source and drain electrodes 151,152 of the TFT. Before this photolithographic and etching stage, the amorphous silicon film 150 may be converted into polycrystalline silicon, for example by using an excimer laser energy beam. However, the amorphous silicon material may be retained for the island 50.

After the photolithographic and etching stage, the gate dielectric film 38 (or its remaining thickness) is deposited. This film 38 may be, for example, silicon nitride in the case of an amorphous silicon film 50. The gate electrode is then provided on the gate dielectric film 38. In the form illustrated by way of example in FIG. 3, this gate electrode is formed by an area of the gate connection track 37 of, for example, aluminium.

Figure 5:
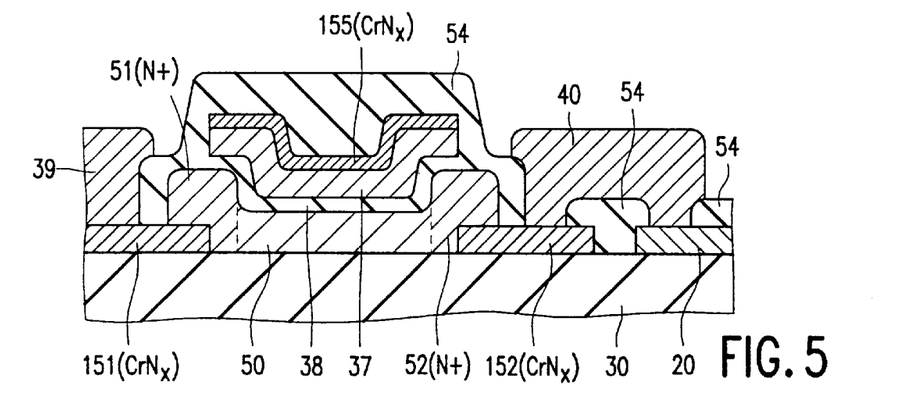
FIG. 5 is a cross-sectional view of yet another TFT in a part of an electronic device in accordance with the present invention.

It will be evident that many modifications and variations are possible within the scope of the present invention. By way of example, FIG. 5 illustrates a few such variations in which the source and drain electrodes 151,152 comprise areas of one chromium nitride film pattern, and the gate electrode 155 comprises an area of a second chromium nitride film pattern. In the FIG. 5 structure, the source and drain electrodes 151,152 extend slightly beyond the TFT silicon island 50 to be contacted by aluminium connection tracks 39 and 40. The gate electrode comprises an aluminium (or aluminium alloy) connection track 37 having the chromium nitride gate film 155 contacting its entire upper face. An aluminium (or aluminium alloy) track 40 connects the chromium nitride drain electrode 152 to an ITO pixel electrode 20. Good electrical contacts can be formed to the chromium nitride upper faces of the electrode parts 151, 152 and 155 at contact windows in the insulating film 54, in the same manner as described for FIG. 2. Furthermore, the chromium nitride electrode parts 151 and 152 can provide good contacts with doped regions 51 and 52 to the silicon film 50 for the source and drain of the TFT, as described for FIG. 3.

Figure 6:
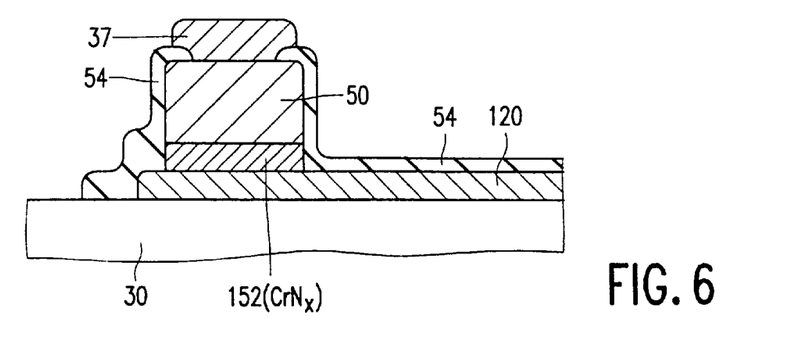
FIG. 6 is a cross-sectional view of a TFD in a part of a further electronic device in accordance with the present invention.

FIGS. 1 to 5 illustrate the use of the invention for TFTs. However, the present invention may be used with other thin-film circuit elements, for example, TFDs as illustrated in FIG. 6. FIG. 6 illustrates a vertical TFD, the body of which is an active semiconductor conductive film 50 sandwiched between a bottom electrode 152 and a top electrode 37. The semiconductor film 50 may comprise silicon-based material in an amorphous form or microcrystalline form or polycrystalline form. An insulating film 54 of, for example, silicon oxide may be present on the side walls of the semiconductor conductive film 50. The top electrode 37 contacts the upper face of the active film 50 at a window in this insulating film 54. In accordance with the present invention, at least one of these electrodes (preferably the bottom electrode 152) comprises a film of chromium nitride. Depending on the orientation of the diode, the electrodes 37 and 152 may be respectively anode and cathode or respectively cathode and anode. The bottom electrode 152 is contacted by a conductor track 120 on the substrate 30. Depending on the device application, the conductor track 120 may comprise ITO or aluminium and/or another material, for example chromium, tungsten, zinc, titanium, molybdenum or nickel.

The TFD of FIG. 6 may be used in a large-area thin-film ROM device such as described in U.S. Pat. No. 5,272,370. Such a diode may be, for example, a PIN diode in which the active semiconductor conductive film 50 is doped with opposite conductivity type dopant concentrations at its upper and lower faces so as to have a PIN region structure. Alternatively, the TFD may be a so-called "MIM" diode which is bidirectional and in which the active semiconductor conductive film 50 is of an undoped (intrinsic, and hence semi-insulating) silicon-rich non-stoichiometric silicon compound material. Such a MIM diode may also be used in a ROM device as described in U.S. Pat. No. 5,272,370. However, such an MIM diode may alternatively be used as a non-linear switching element in a display device as described in EP-A-0 649 048. A PIN diode constructed as in FIG. 6 may also be used as a switching diode and/or as a photosensing diode in a large-area imaging device. The n-type region of such a PIN diode may be formed by phosphorus diffusion from the surface of the chromium nitride electrode 152, using the $PH_3$ plasma doping treatment. A similar plasma treatment for boron doping for a p-type region is possible using diborane ($B_2H_6$) instead of phosphine.

It should be noted that there is a difference in the desired electrical contact properties for a PIN diode and for a MIM. For a PIN diode a good low-resistance ohmic contact is desired between the electrodes 37,152 and the p type and n type regions of the film 50. Chromium nitride can provide such an ohmic contact, because of its low affinity for oxide growth and because it also has a dopant-adsorption potential for doping the film 50. In the case of a MIM diode, the silicon-compound film 50 has a wider bandgap and the desired electrode contact property is more like a Schottky barrier than an ohmic contact. However, the use of chromium nitride for the MIM electrode permits control of the Schottky barrier behaviour by varying the nitrogen percentage of the Schottky electrode to reduce an irregular oxide interface between the Schottky electrode and the silicon-compound film 50.

The chromium nitride films used for the different electrode arrangements in FIGS. 1 to 6 may typically have thicknesses in the range of 25 nm to 100 nm. For the specific experimental results now to be given with reference to FIGS. 7 to 10, the chromium nitride film thickness was 35 nm. It is difficult to obtain good surface coverage free of pinholes with film thicknesses of less than 20 nm. The use of film thicknesses greater than about 100 nm becomes less desirable as regards step coverage by subsequently deposited films. The thicker chromium nitride films may be used when the side walls of the chromium nitride film pattern are tapered.

Figure 7:
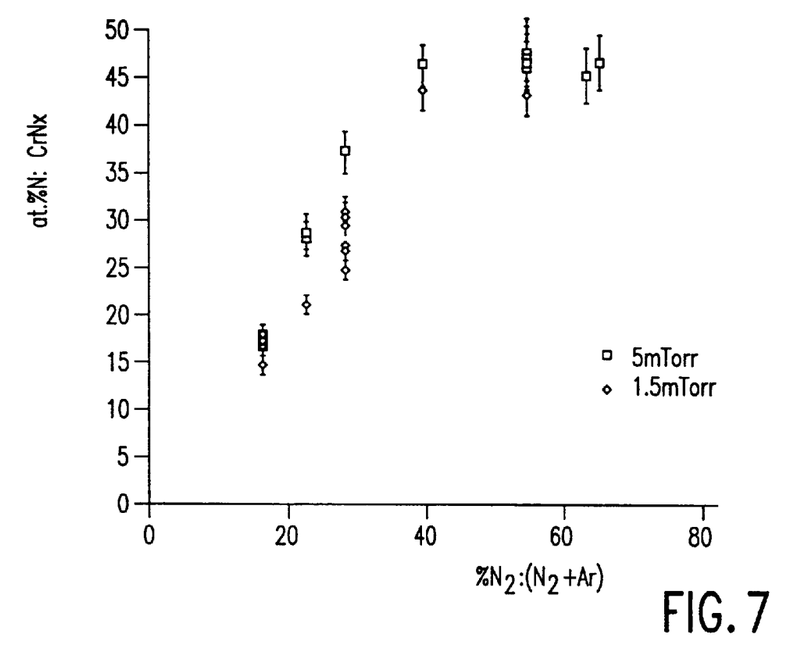
FIG. 7 is a graph showing the atomic percentage of nitrogen (at. % N) in a deposited film of chromium nitride ($CrN_x$) as a function of the percentage of nitrogen (% $N_2$) in the sputter gas mixture ($N_2$+Ar)

The chromium nitride films used in accordance with the present invention may be deposited as polycrystalline or amorphous CrN with an atomic percentage of nitrogen of about 50% and/or as $Cr_2N$ with a nitrogen atomic percentage of about 30% or more. In fact, the nitrogen atomic percentage in the chromium nitride film may be varied over a useful range between 15% and 50% by varying the percentage of nitrogen in the sputter gas mixture. This is illustrated in FIG. 7. Chromium is used as the sputter source target. The sputtering was carried out with a gas mixture of argon and nitrogen. The experimental results of FIG. 7 were obtained at two gas pressures, namely 1.5 mTorr and 5 mTorr. The substrate temperature was raised to 350° C. before deposition and dropped to 300° C. at the beginning of deposition. The deposition parameters used are shown in the following table:

| Pressure (mTorr) | 1.5 | 1.5 | 1.5 | 5 | 5 | 5 | 5 | 5 |
|---|---|---|---|---|---|---|---|---|
| % N in gas mix | 17 | 23 | 29 | 17 | 23 | 29 | 56 | 66 |

The chromium nitride was deposited to a thickness of 35 nm. Auger electron spectroscopy was used to measure the nitrogen content in the chromium nitride film and the oxygen content at the silicon interface with the chromium nitride film 151,152. FIG. 7 is a plot of the nitrogen content in the deposited $CrN_x$ film as a function of the nitrogen content of the gas mixture at the two pressures used. The 5 mTorr curve flattens out at about 40 atomic percent N.

Figure 8:
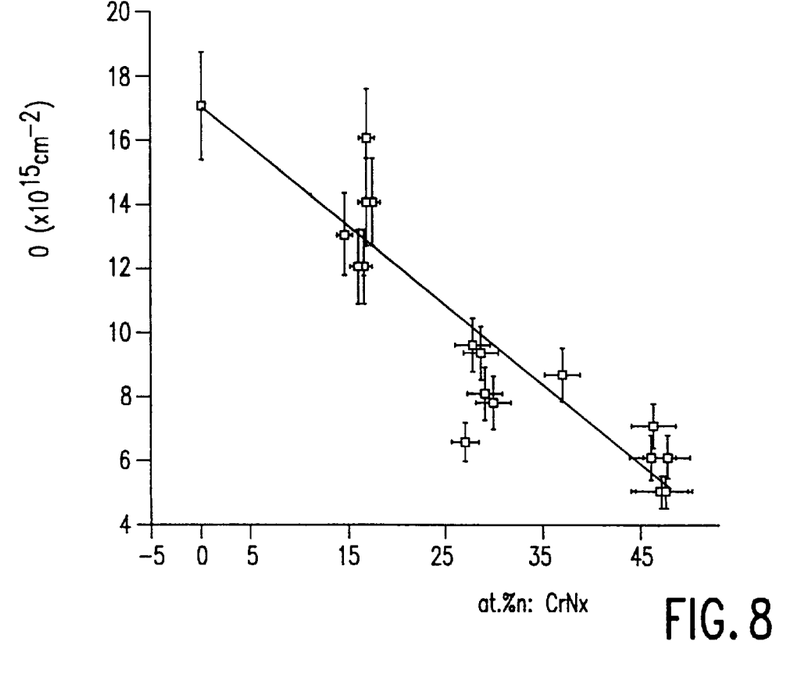
FIG. 8 is a graph showing the concentration of oxygen (O) in $10^{15}$ oxygen atoms $cm^{-2}$ as a function of the atomic percentage of nitrogen (at. % N) in the chromium nitride film ($CrN_x$)

FIG. 8 shows a plot of the areal concentration of oxygen at the silicon interface with the $CrN_x$ film 151,152, as a function of the atomic percentage of N in the $CrN_x$ film. Oxygen in the ambient provides the source of this interface oxygen, both while the substrate 30 is being heated up before deposition begins and also during deposition of the film 150. There is a good inverse correlation between the two percentages in FIG. 8, showing that the amount of oxide at this interface can be controlled by regulating the $CrN_x$ deposition parameters.

Thus, the nitrogen content of the sputter deposited chromium nitride film is a function of the nitrogen content and pressure of the sputter gas mixture. The amount of oxide present at the interface of a bottom chromium nitride electrode 151,152 and an overlying semiconductor conductive film 50 is a function of the nitrogen content of the chromium nitride film. Thus, the amount of oxide at the contact interface can be controlled by regulating the chromium nitride deposition parameters.

Figure 9:
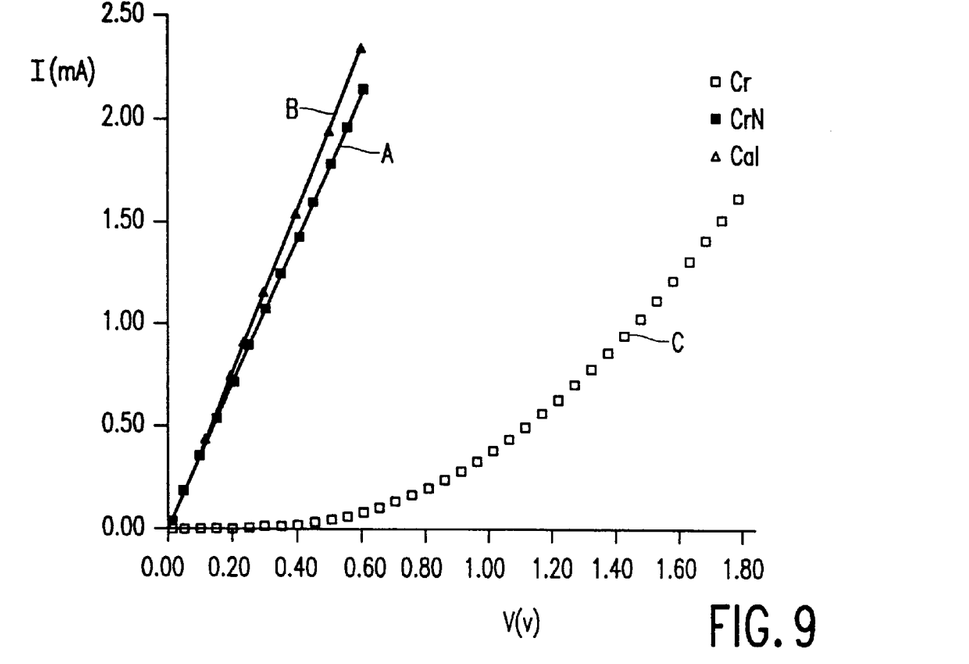
FIG. 9 is a graph showing the variation of current (I) in milliAmps with applied voltage (V) in volts for 3 different test structures of the same layout geometry comprising an aluminium connection track contacting a chromium nitride electrode for curve A, an aluminium connection track contacting a chromium electrode for curve B, and a calculated comparison resistance in the form of an integral chromium nitride track for curve C.

FIG. 9 illustrates the good quality of contact between an aluminium connection track 37,39 or 40 and a chromium nitride electrode 155,151 or 152. The electrical contact between the two films was over an area of 6 $\mu$m by 6 $\mu$m. Curves A and C correspond to this contact area at a contact window in an insulating film 54 as illustrated in FIG. 2. The measurements were made by applying a voltage difference between two electrical connections respectively made to the two films at a short distance from the contact area. As a result of this distance from the contact area to the connections, some resistance is present in the longitudinal current path along each film. The effect of this resistance for an integral chromium nitride track between the two connections is given by curve B in FIG. 9. Thus, curve B provides a reference against which the quality of the contacts between the two films can be compared. Curve B indicates the ideal contact characteristic. Curve A is for an aluminium connection track contacting a chromium nitride electrode, and its close similarity to curve B indicates the very good quality of the contact between these two films. Curve C is for an aluminium connection track contacting a chromium electrode. As can be seen from FIG. 9, the curve C characteristic is far from ideal and shows a non-ohmic contact with a potential barrier of about 1 volt between the aluminium and the chromium. This potential barrier is believed to be due to the presence of the hard and insoluble oxygen-containing high-resistance surface skin on the chromium electrode.

Figure 10:
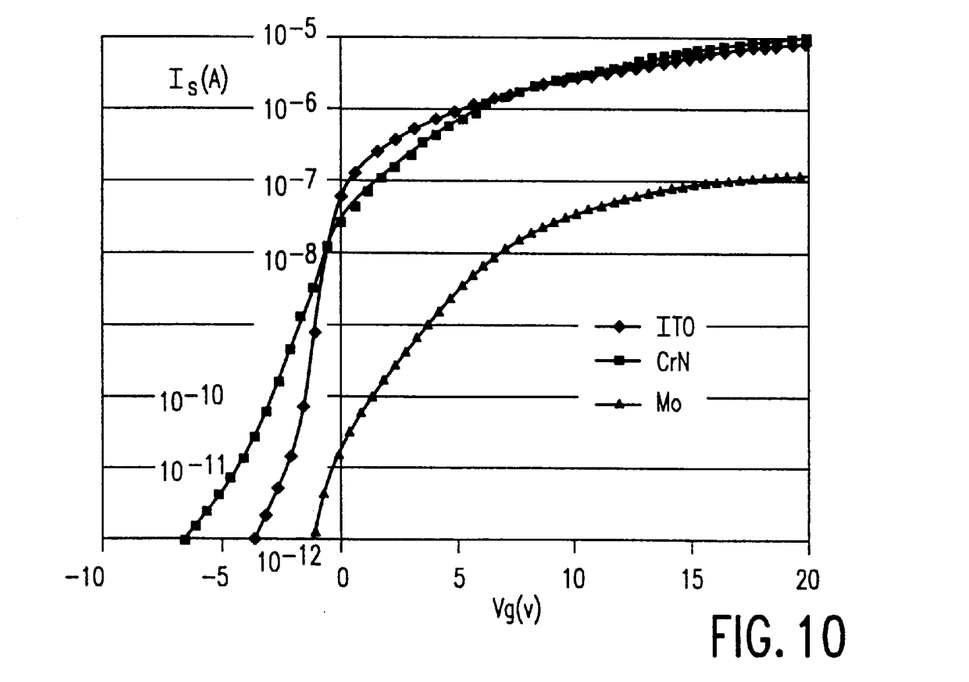
FIG. 10 is a graph showing the variation of source current ($I_s$) in Amps with gate bias (Vg) in volts for 3 different top-gate TFT structures of the same geometry having bottom source and drain electrodes of chromium nitride for curve A, ITO for curve B and molybdenum for curve C.

FIG. 10 illustrates the quality of the electrical contact between bottom source and drain electrodes 151 and 152 of chromium nitride and the TFT channel film 50 of amorphous silicon. The source-gate characteristics plotted in FIG. 10 are a measure of the on resistance of the TFT, and hence are a measure of the resistance of the source and drain contacts. Three different top-gate structures of the same geometry were fabricated, but having bottom source and drain electrodes of different materials. The bottom source and drain electrodes were of chromium nitride for curve A, ITO for curve B and molybdenum for curve C. All three electrode materials were subjected to the same $PH_3$ plasma doping treatment before depositing the silicon film 150. The source-gate characteristics of FIG. 10 were measured with a drain bias of 0.25 volts. As can be seen from FIG. 10, the source-gate characteristic for chromium nitride bottom source and drain electrodes 151 and 152 is comparable to that for ITO bottom source and drain electrodes and is two orders of magnitude better than that for molybdenum bottom source and drain electrodes.

The plasma doping treatment described in the said Japan Display '89 conference paper involves adsorption of a dopant to the electrode pattern by exposure to a dopant source plasma, for example of $PH_3$. It is also possible to add a source of semiconductor material (for example $SiH_4$) to the dopant source plasma, and thereby to deposit selectively a thin doped silicon skin on the surface of the electrode pattern, without depositing a film on the insulating substrate surface exposed between the electrode pattern. Such a selective doped-silicon deposition may be achieved not only on an ITO electrode pattern but also on a chromium nitride electrode pattern in accordance with the present invention. However, selective deposition of a doped silicon skin seems to allow no further improvement in the electrical contact characteristics over those obtained by doping from adsorbed-dopant on a chromium nitride electrode. It is difficult to control the parameters for such a selective doped-silicon deposition, and so a plasma doping treatment without silicon deposition is currently preferred.

Figure 11:
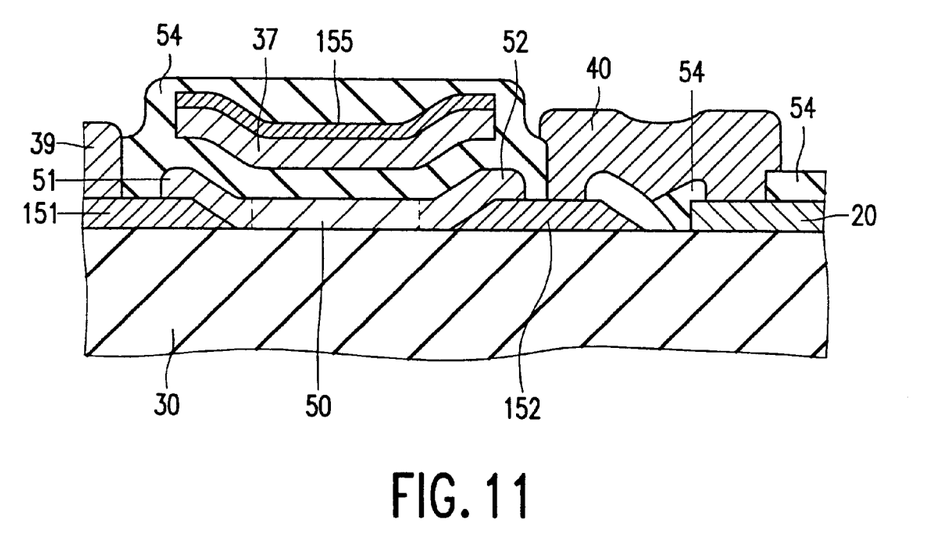
FIG. 11 is a cross-sectional view illustrating a modification to the TFT of FIG. 5, in which the source and drain electrodes have tapered side wall surfaces.

As mentioned previously, thicker chromium nitride films may be used for the different electrode arrangements of FIGS. 1 to 6 when the side walls of the chromium nitride film pattern are tapered. A dry etching process could be used to this end. However, such a process tends to be expensive. By using the different etching rates of chromium nitride films with different nitrogen percentage contents, this tapering can be achieved conveniently using a wet etch process. Thus, the deposited chromium nitride film may have a graded nitrogen content through its thickness such that the concentration of nitrogen in the film reduces from a high value adjacent to the top surface of the film, i.e. it increases away from the substrate surface. In this case tapered, or bevelled, side walls whose surfaces slope downwards towards the substrate are created upon patterning the film by means of a wet etch process, for example using ammonium ceric nitrate with nitric acid and/or hydrochloric acid, due to a differential etching effect resulting from the chromium nitride with a higher nitrogen content etching at a faster rate. FIG. 11 shows by way of example a cross-sectional view through a TFT generally corresponding with that of FIG. 5 but whose source and drain electrodes 151 and 152 have tapered side walls obtained in this manner. Such tapering may be applied to, for example, the source and drain electrodes 151 and 152 in the top-gate TFT structures of FIGS. 3 and 5. In this way additional advantages can be obtained, similar to those discussed in EP-B-0221361 with regard to a top-gate TFT structure having source and drain electrodes of ITO material with tapered side walls. In particular, it enables the thickness of the semiconductor film 50 required to be reduced. The tapered source and drain electrodes 151 and 152 may still be doped as described previously to provide the doped source and drain regions 51 and 52 in the subsequently deposited semiconductor film 50.

Of course, tapering resulting from the use of a chromium nitride film having a graded nitrogen content together with a wet etch process can be applied to other electrode arrangements, for example, the lower electrode of a TFD. In the case of the active semiconductor conductive film 50, for example of silicon-rich non-stoichiometric silicon compound material such as a silicon nitride material in a MIM type TFD, extending in the TFD completely over and to either side of the lower electrode then tapering of the electrode will assist in avoiding step coverage problems when a relatively thick chromium nitride electrode is used.

Figure 12:
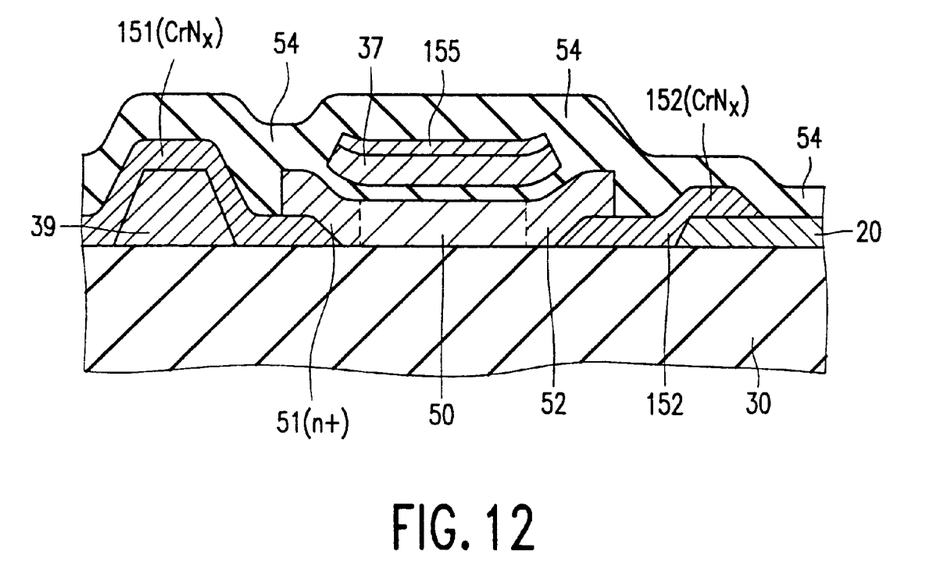
FIG. 12 is a cross-sectional view illustrating a further modification of the TFT of FIG. 5, in which the source electrode extends over a connection track.

FIG. 12 illustrates an advantageous low-resistance connection arrangement for a bottom electrode 151 of chromium nitride in accordance with the invention. In the particular example shown in FIG. 12, the thin-film circuit element is a TFT, and the film 151 of chromium nitride forms one of the source and drain electrodes of the TFT. As shown in FIG. 12, the electrode film 151 of chromium nitride extends laterally from a connection track 39 to the area of the TFT, and the connection track 39 is present at an area of the substrate 30 which is offset with respect to the area where the TFT is formed. The TFT of FIG. 12 may be, for example, one of the switching elements of the device matrix, and the track 39 may be, for example, a column conductor in a device matrix. The track 39 is of higher conductivity material than the chromium nitride and is thicker than the film 151. The track 39 may be of, for example, molybdenum or a molybdenum alloy, or more preferably of aluminium or an aluminium alloy which have particularly high conductivity. This offset arrangement illustrated in FIG. 12 is similar to that of the connection track 39 and TFT body 50 of the FIG. 5 device. Similar offset arrangements may be adopted for the TFT of FIG. 3 (by reducing the area A in FIG. 4C relative to the spacing between the areas 121,20) and for the TFD of FIG. 6 (by changing the lateral extents of the films 120 and 152).

In the modification illustrated in FIG. 12, the chromium nitride electrode film 151 is deposited over the track 39. This provision of the chromium nitride film 151 over the connection track 39 physically caps the track 39 and can thereby reduce surface oxidation and hillock formation in the aluminium track 39 when heated during subsequent processing stages. The chromium nitride film 151 can also act as a barrier against diffusion of aluminium and other impurity from the track 39 into the TFT body 50. Undesirable interactions with the TFT body 50 are also minimised because of the offset arrangement of the track 39, and this offset arrangement also avoids introducing a step-coverage problem over the sides of the thick track 39.

From reading the present disclosure, other modifications and variations will be apparent to persons skilled in the art. Such modifications and variations may involve equivalent features and other features which are already known in the design, manufacture and use of electronic devices comprising TFTs, TFDs and other thin-film circuit elements, and component parts thereof, and which may be used instead of or in addition to features already disclosed herein. Although claims have been formulated in this Application to particular combinations of features, it should be understood that the scope of the disclosure of the present application includes any and every novel feature or any novel combination of features disclosed herein either explicitly or implicitly and any generalisation thereof, whether or not it relates to the same invention as presently claimed in any claim and whether or not it mitigates any or all of the same technical problems as does the present invention. The Applicants hereby give notice that new claims may be formulated to such features and/or combinations of such features during prosecution of the present application or of any further application derived therefrom.

What is claimed is:

1. An electronic device including a thin-film circuit element which comprises an electrode in electrical contact with a conductive semiconductor film, for example of a silicon-based material, wherein the electrode comprises a film of chromium nitride at least adjacent an area of the semiconductor film, the chromium nitride film being present between said adjacent area of the semiconductor film and an impurity source area, the impurity source area comprises a film pattern which is in electrical contact with the electrode and which is of higher conductivity material than the chromium nitride, for example indium tin oxide or aluminium, and the chromium nitride film provides an impurity diffusion barrier protecting said adjacent area of the semiconductor film.

2. An electronic device as claimed in claim 1, wherein said adjacent area of the semiconductor conductive film is doped with a conductivity type determining dopant concentration extending from the electrode.

3. An electronic device as claimed in claim 1, wherein the circuit element is a thin-film transistor having a source or drain electrode which comprises the film of chromium nitride.

4. An electronic device as claimed in claim 3, wherein the source or drain electrode comprising the film of chromium nitride has tapered side walls over which the semiconductor conductive film extends to provide a channel region of the transistor.

5. An electronic device as claimed in claim 1, wherein the circuit element is a thin-film diode having regions of the semiconductor conductive film doped with opposite conductivity type dopant concentrations to provide a PIN region structure, and an anode or cathode electrode of the diode comprises the film of chromium nitride.

6. An electronic device as claimed in claim 1, wherein the circuit element is a thin-film diode, the semiconductor conductive film is a silicon-rich non-stoichiometric silicon compound material, and an electrode of the diode comprises the film of chromium nitride.

7. An electronic device as in claim 3, wherein the semiconductor film extends between and on the source and drain electrodes on a substrate of the device to provide a channel region of the thin-film transistor between the source and drain electrodes, and the film of chromium nitride provides at least an upper part of the source and drain electrodes adjacent to the semiconductor film.

8. An electronic device as in claim 7, wherein the film of chromium nitride is present over a connection track for one of the source and drain electrodes, the connection track being formed by the film pattern of the higher conductivity material, for example aluminum.

9. An electronic device as in claim 8, wherein the connection track is present at an area of the substrate offset with respect to an area where the transistor is present, and in that the film of chromium nitride extends laterally from the connection track to the area of the transistor.

10. An electronic device as claimed in claim 3, wherein the thin-film transistor is a top-gate thin-film transistor.

11. An electronic device as claimed in claim 10, the top-gate thin-film transistor has a gate electrode of chromium nitride at least at its upper face, and a gate connection track of, for example, aluminium contacts electrically an upper face of the gate electrode at a window in an insulating film of, for example, silicon oxide on the gate electrode.

* * * * *